US009324657B2

(12) United States Patent
Seo et al.

(10) Patent No.: US 9,324,657 B2
(45) Date of Patent: Apr. 26, 2016

(54) SEMICONDUCTOR PACKAGE AND METHOD OF FABRICATING THE SAME

(71) Applicants: Jangmee Seo, Seoul (KR); Heeseok Lee, Yongin-si (KR); Jong-won Lee, Seoul (KR)

(72) Inventors: Jangmee Seo, Seoul (KR); Heeseok Lee, Yongin-si (KR); Jong-won Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/534,607

(22) Filed: Nov. 6, 2014

(65) Prior Publication Data

US 2015/0130041 A1    May 14, 2015

(30) Foreign Application Priority Data

Nov. 8, 2013 (KR) ........................ 10-2013-0135472

(51) Int. Cl.

| | |
|---|---|
| *H01L 23/64* | (2006.01) |
| *H01L 23/538* | (2006.01) |
| *H01L 25/00* | (2006.01) |
| *H01L 23/31* | (2006.01) |
| *H01L 25/10* | (2006.01) |
| *H01L 25/16* | (2006.01) |
| *H01L 23/00* | (2006.01) |
| *H01L 25/065* | (2006.01) |
| *H01L 23/498* | (2006.01) |

(52) U.S. Cl.
CPC ........ *H01L 23/5384* (2013.01); *H01L 23/3128* (2013.01); *H01L 23/5389* (2013.01); *H01L 25/105* (2013.01); *H01L 25/16* (2013.01); *H01L 25/50* (2013.01); *H01L 23/49822* (2013.01); *H01L 24/16* (2013.01); *H01L 24/32* (2013.01); *H01L 24/48* (2013.01); *H01L 24/73* (2013.01); *H01L 25/0655* (2013.01); *H01L 2224/0401* (2013.01); *H01L 2224/04042* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); *H01L 2225/1058* (2013.01); *H01L 2225/1082* (2013.01); *H01L 2924/12042* (2013.01); *H01L 2924/15311* (2013.01); *H01L 2924/15331* (2013.01); *H01L 2924/1815* (2013.01); *H01L 2924/18161* (2013.01); *H01L 2924/19041* (2013.01); *H01L 2924/19042* (2013.01);

(Continued)

(58) Field of Classification Search
CPC .......... H01L 2924/15311; H01L 2224/32145; H01L 2224/73204; H01L 2224/1308; H01L 23/3128; H01L 2224/48145; H01L 25/0657; H01L 23/5389; H01L 2224/16145; H01L 2924/30107; H01L 21/56; H01L 23/49827; H01L 23/04; H01L 23/64; H01L 25/50; H01L 25/074; H01L 23/5386
See application file for complete search history.

(56) References Cited

U.S. PATENT DOCUMENTS

| | | | |
|---|---|---|---|
| 6,861,288 B2 * | 3/2005 | Shim .................. | H01L 25/0657 257/686 |
| 7,242,081 B1 | 7/2007 | Lee | |

(Continued)

FOREIGN PATENT DOCUMENTS

| | | |
|---|---|---|
| KR | 10-2007-0111886 A | 11/2007 |
| KR | 10-2008-0005741 A | 1/2008 |
| KR | 10-2012-0058302 A | 6/2012 |

*Primary Examiner* — Roy Potter
(74) *Attorney, Agent, or Firm* — Sughrue Mion, PLLC

(57) ABSTRACT

Provided are semiconductor packages and methods of fabricating the same. The method may include, stacking a lower semiconductor chip on a lower package substrate, forming a lower molding layer on the lower package substrate, forming a connecting through-hole and an element through-hole by performing a laser drilling process on the lower molding layer, and stacking an upper package substrate having a bottom surface to which a passive element is bonded on the lower package substrate to insert the passive element into the element through-hole.

14 Claims, 12 Drawing Sheets

(52) U.S. Cl.
CPC ............... *H01L2924/19043* (2013.01); *H01L 2924/19106* (2013.01)

(56) References Cited

U.S. PATENT DOCUMENTS

| | | | |
|---|---|---|---|
| 7,714,432 B2 | 5/2010 | Tang | |
| 8,022,528 B2 | 9/2011 | Kim | |
| 8,253,228 B2 | 8/2012 | Kim et al. | |
| 8,264,846 B2 | 9/2012 | Jones et al. | |
| 2004/0016996 A1 | 1/2004 | Tang | |
| 2004/0026715 A1 | 2/2004 | Rabadam et al. | |
| 2008/0142961 A1 | 6/2008 | Jones et al. | |
| 2011/0063805 A1 | 3/2011 | Kim | |
| 2011/0241168 A1 | 10/2011 | Kim et al. | |
| 2014/0291868 A1* | 10/2014 | Lee ................... | H01L 25/105 257/777 |

* cited by examiner

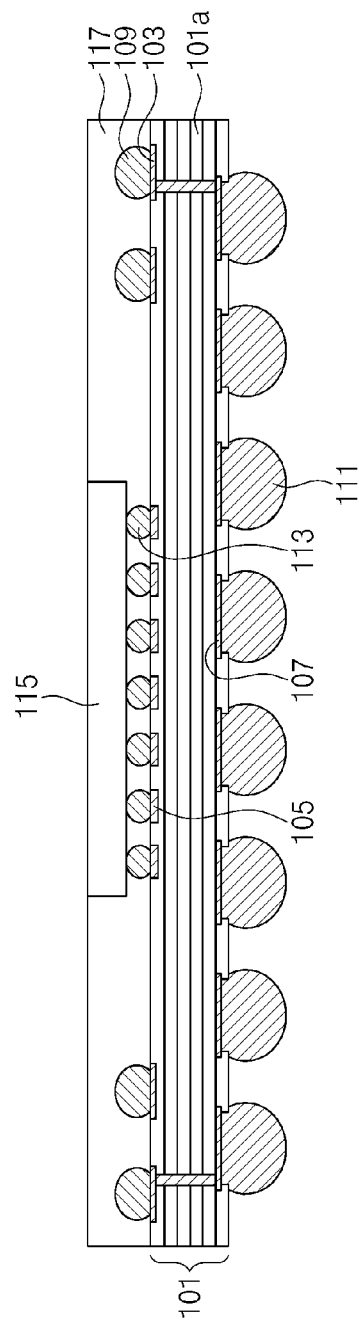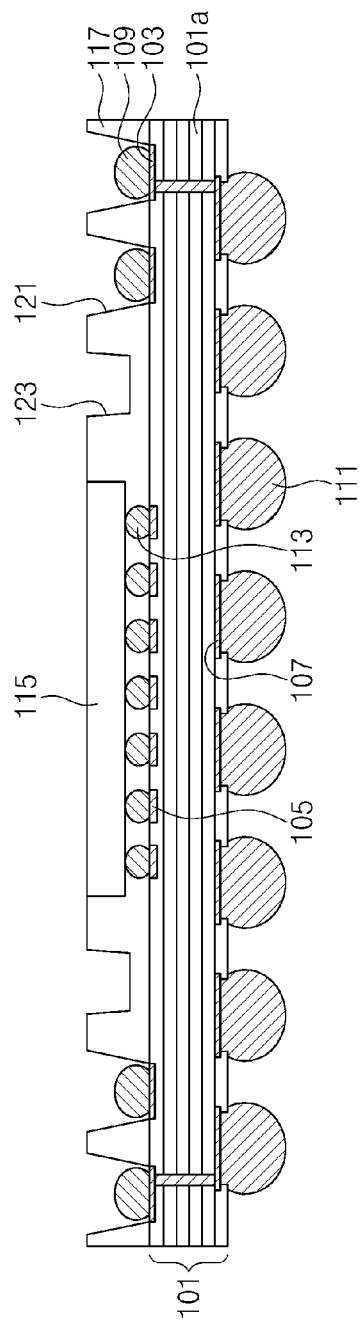

SEMICONDUCTOR PACKAGE AND METHOD OF FABRICATING THE SAME

CROSS-REFERENCE TO RELATED APPLICATION

This application claims priority from Korean Patent Application No. 10-2013-0135472, filed on Nov. 8, 2013, in the Korean Intellectual Property Office, the disclosure of which is hereby incorporated by reference in its entirety.

BACKGROUND

Apparatuses and methods consistent with exemplary embodiments relate to semiconductor packages and methods of fabricating the same and, more particularly, to semiconductor packages including passive elements and methods of fabricating the same.

In the semiconductor industry, there is an increased demand for high capacity, thin and small sizes of semiconductor devices and electronic products using the semiconductor devices. Thus, various packaging techniques have been suggested. For example, a semiconductor package may include integrated semiconductor chips having various functions and may have a smaller area than a general package having one semiconductor chip.

A package-on-package (PoP) technique including stacked packages has been suggested in order to realize a high density package including a plurality of semiconductor chips. A PoP-type semiconductor package may be used in order to satisfy small sizes of electronic portable devices and multi-function of mobile products.

Additionally, it is considered that passive elements are mounted on semiconductor packages in order to improve a power integrity characteristic.

SUMMARY

One or more exemplary embodiments may provide methods of fabricating a semiconductor package including a passive element.

One or more exemplary embodiments may also provide semiconductor packages including passive elements.

According to an aspect of an exemplary embodiment, there is provided a method of fabricating a semiconductor package, the method including stacking a lower semiconductor chip on a lower package substrate; forming a lower molding layer on the lower package substrate; forming a connecting through-hole and an element through-hole by performing a laser drilling process on the lower molding layer; and stacking an upper package substrate having a bottom surface to which a passive element is bonded on the lower package substrate to insert the passive element into the element through-hole.

The element through-hole may be formed between the lower semiconductor chip and the connecting through-hole.

The element through-hole may include a plurality of element through-holes, and the passive element may include a plurality of passive elements provided in the plurality of element through-holes. The plurality of element through-holes may be disposed at both sides of the lower semiconductor chip.

The element through-hole may be disposed at one side of the lower semiconductor chip.

The connecting through-hole may be formed to expose a lower conductive connection part formed on the lower package substrate, and a bottom surface of the element through-hole may be higher than a top surface of the lower package substrate.

The connecting through-hole may be formed to expose a lower conductive connection part formed on the lower package substrate, and the element through-hole may be formed to expose a top surface of the lower package substrate.

According to an aspect of another exemplary embodiment, there is provided a semiconductor package, the semiconductor package including a lower package including a lower package substrate, a lower semiconductor chip stacked on the lower package substrate, and a lower molding layer which covers the lower semiconductor chip on the lower package substrate and includes an element through-hole, and an upper package, which is stacked on the lower package, including an upper package substrate, an upper semiconductor chip stacked on the upper package substrate, and a passive element bonded to a bottom surface of the upper package substrate. The passive element may be inserted in the element through-hole.

The lower molding layer may further include a connecting through-hole in which a conductive connection part is inserted. The conductive connection part may electrically connect the lower package substrate to the upper package substrate, and the element through-hole may be disposed between the lower semiconductor chip and the connecting through-hole.

The element through-hole may include a plurality of element through-holes, and the passive element may include a plurality of passive elements inserted in the plurality of element through-holes. The plurality of element through-holes may be disposed at both sides of the lower semiconductor chip.

The connecting through-holes may include a plurality of connecting through-holes, and the conductive connection part may include a plurality of conductive connection parts inserted in the plurality of connecting through-holes. The element through-hole may be disposed between a first sidewall of the lower semiconductor chip and the conductive connection part adjacent to the first sidewall of the lower semiconductor chip. A distance between the first sidewall of the lower semiconductor chip and the conductive connection part adjacent to the first sidewall of the lower semiconductor chip may be greater than a distance between a second sidewall of the lower semiconductor chip and the conductive connection part adjacent to the second sidewall of the lower semiconductor chip.

A bottom surface of the element through-hole may be higher than a top surface of the lower package substrate.

The semiconductor package may further include a first element interconnection and a second element interconnection provided on the bottom surface of the upper package substrate. The first element interconnection and the second element interconnection may be electrically connected to one surface of the passive element.

The element through-hole may expose a top surface of the lower package substrate.

The semiconductor package may further include a first element interconnection disposed on the top surface of the lower package substrate and exposed by the element through-hole; and a second element interconnection disposed on the bottom surface of the upper package substrate and facing the first element interconnection. One surface of the passive element may be in contact with the first element interconnection, and another surface of the passive element may be in contact with the second element interconnection.

The conductive connection part may be in contact with an inner sidewall of the connecting through-hole.

According to an aspect of another exemplary embodiment, there is provided a semiconductor package, the semiconductor package including a lower package substrate, a lower semiconductor chip mounted on the lower package substrate, an upper package substrate stacked on the lower package substrate, at least one upper semiconductor chip mounted on the upper package substrate, and a passive element disposed on a bottom surface of the upper package substrate.

BRIEF DESCRIPTION OF THE DRAWINGS

The above and/or other aspects will become more apparent from the following drawings and accompanying description.

FIGS. 8A to 8E are cross-sectional views illustrating a method of fabricating a semiconductor package according to another exemplary embodiment;

DETAILED DESCRIPTION OF THE EMBODIMENTS

Figure 1:
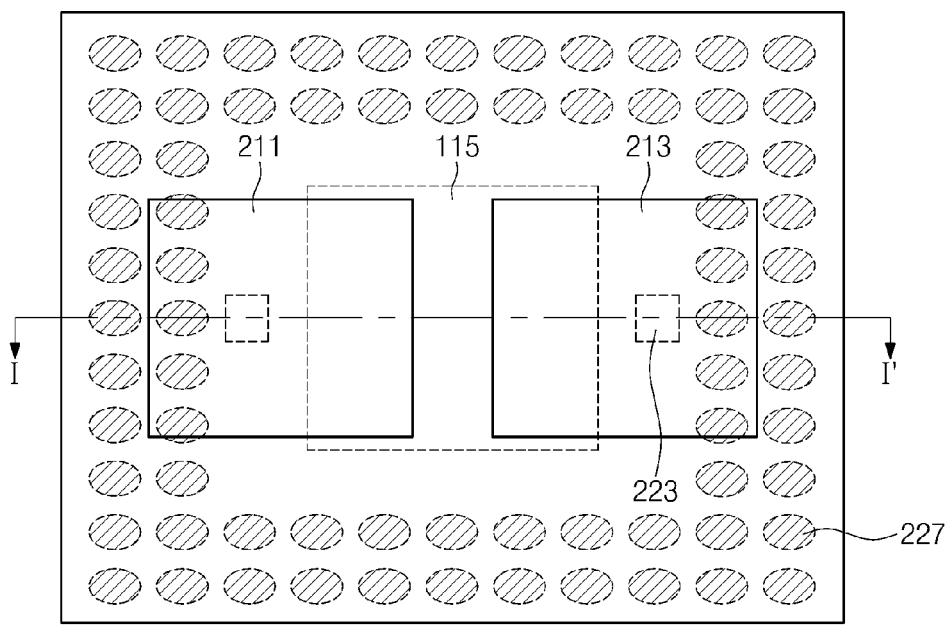
FIG. 1 is a plan view illustrating a semiconductor package according to an exemplary embodiment.

Exemplary embodiments will now be described more fully with reference to the accompanying drawings, in which various exemplary embodiments are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, exemplary embodiments are not limited to the specific examples provided herein and are exaggerated for clarity.

The terminology used herein is for describing the exemplary embodiments and is not for delimiting the embodiments. As used herein, the singular terms "a," "an" and "the" may include the plural forms unless otherwise specified. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the exemplary embodiment in the detailed description will be described with reference to sectional views as ideal embodiments of the exemplary embodiments. Accordingly, shapes of the exemplary embodiments may be modified according to manufacturing techniques and/or allowable errors. Therefore, the exemplary embodiments are not limited to the specific shape illustrated in the exemplary embodiments, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms "first", "second", "third", etc. may be used herein to describe various elements, these elements should not be limited by these terms. These terms are only used to distinguish one element from another element. Thus, a first element in an exemplary embodiment could be termed a second element in another exemplary embodiment without departing from the teachings of the exemplary embodiments. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
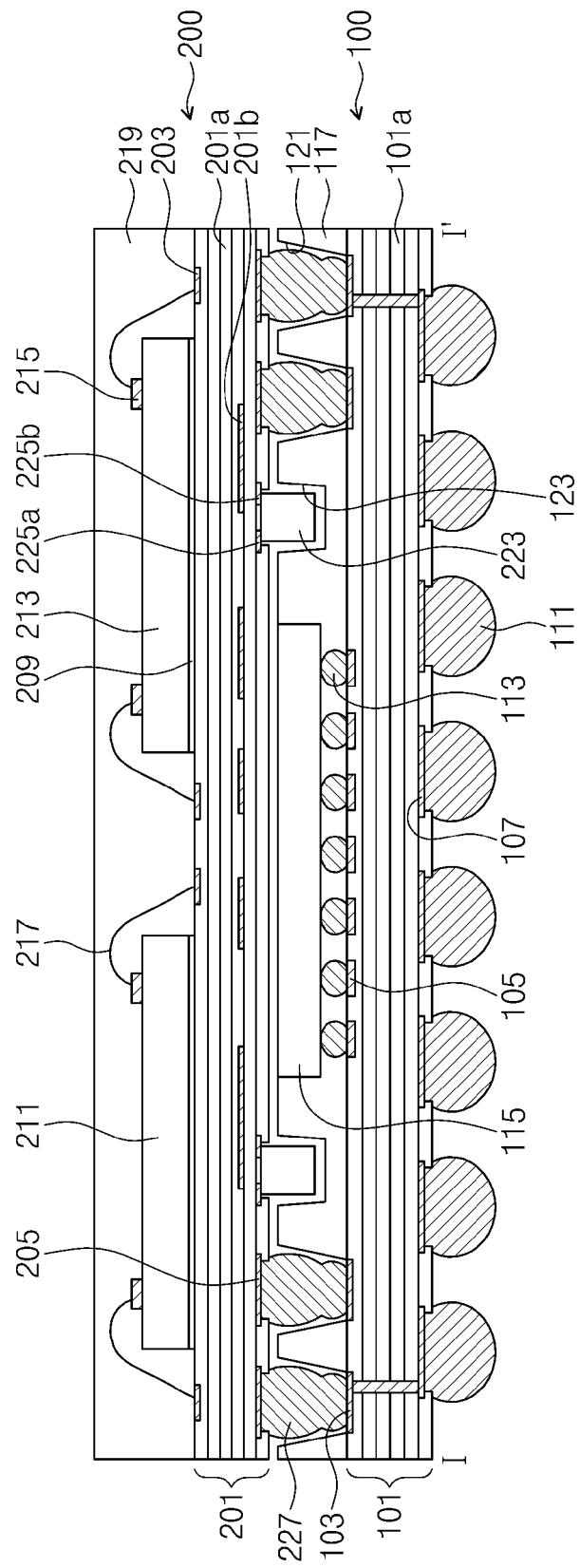
FIG. 2 is a cross-sectional view taken along a line I-I' of FIG. 1 to illustrate a semiconductor package according to a first exemplary embodiment.
Figure 3:
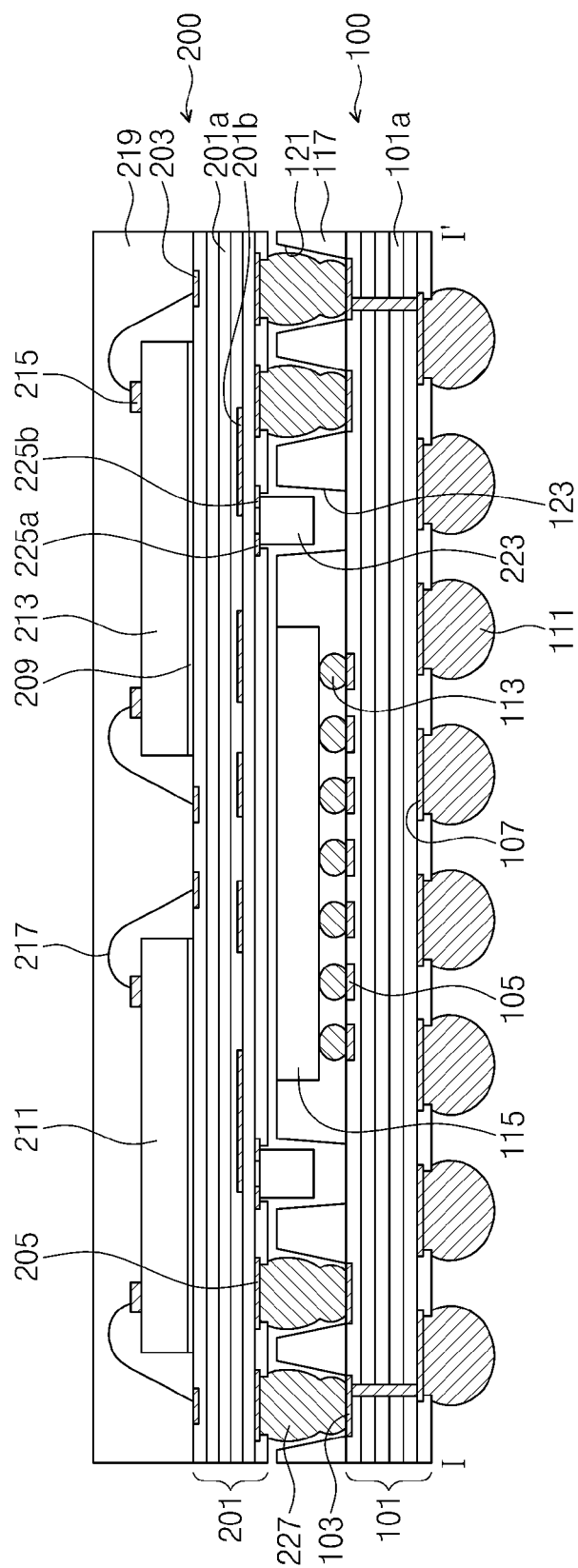
FIG. 3 is a cross-sectional view taken along a line I-I' of FIG. 1 to illustrate a semiconductor package according to a second exemplary embodiment.
Figure 4:
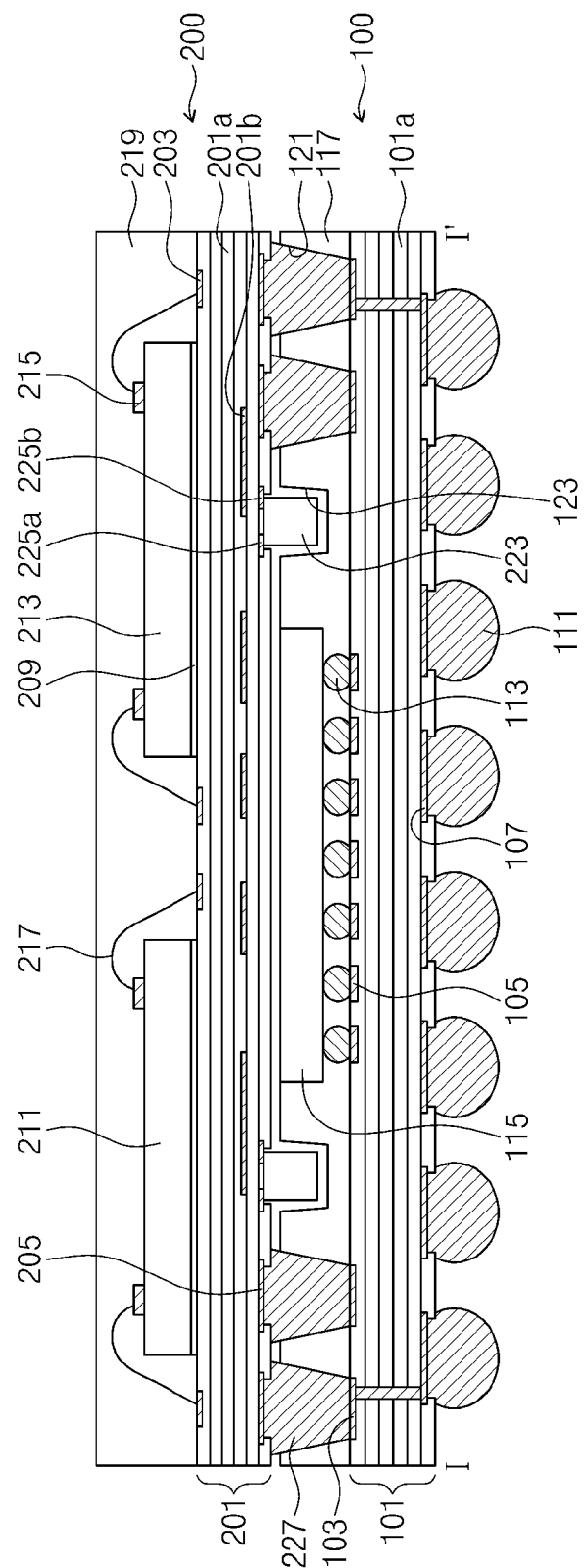
FIG. 4 is a cross-sectional view taken along a line I-I' of FIG. 1 to illustrate a semiconductor package according to a third exemplary embodiment.
Figure 5:
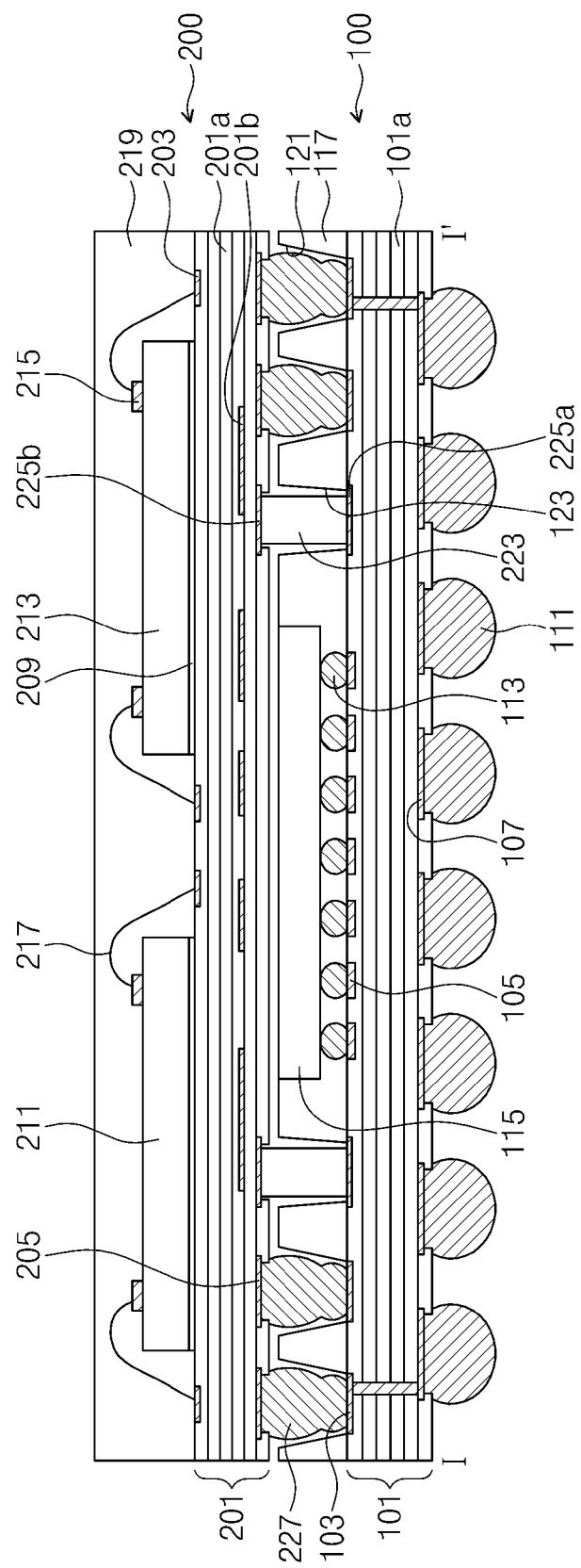
FIG. 5 is a cross-sectional view taken along a line I-I' of FIG. 1 to illustrate a semiconductor package according to a fourth exemplary embodiment.

FIG. 1 is a plan view illustrating a semiconductor package according to an exemplary embodiment. FIG. 2 is a cross-sectional view taken along a line I-I' of FIG. 1 to illustrate a semiconductor package according to a first exemplary embodiment. FIG. 3 is a cross-sectional view taken along a line I-I' of FIG. 1 to illustrate a semiconductor package according to a second exemplary embodiment. FIG. 4 is a cross-sectional view taken along a line I-I' of FIG. 1 to illustrate a semiconductor package according to a third exemplary embodiment. FIG. 5 is a cross-sectional view taken along a line I-I' of FIG. 1 to illustrate a semiconductor package according to a fourth exemplary embodiment.

Referring to FIGS. 1 and 2, a semiconductor package includes a lower package 100 and an upper package 200 stacked on the lower package 100.

The lower package 100 may include a lower package substrate 101, a lower semiconductor chip 115 mounted on the lower package substrate 101, chip bumps 113 electrically connecting the lower package substrate 101 to the lower semiconductor chip 115, and a lower molding layer 117 covering the lower semiconductor chip 115 on the lower package substrate 101.

The lower package substrate 101 may be a multi-layered printed circuit board (PCB). The lower package substrate 101 may include a plurality of stacked insulating layers 101a. Inner interconnections (not shown) may be disposed between the insulating layers 101a. Lower connecting pads 103 may be disposed on a top surface of an edge portion of the lower package substrate 101. Chip pads 105 may be disposed on a top surface of a center portion of the lower package substrate 101. Additionally, ball lands 107 may be disposed on a bottom surface of the lower package substrate 101. External terminals 111 may be bonded to the ball lands 107, respectively. The semiconductor package may be electrically connected to an external device through the external terminals 111.

The lower semiconductor chip 115 may be disposed on the chip pads 105. The chip bumps 113 are bonded to a bottom surface of the lower semiconductor chip 115, and may be in contact with the chip pads 105, so that the lower semiconductor chip 115 may be electrically connected to the lower package substrate 101. The lower semiconductor chip 115 may be, for example, a logic device (e.g., a microprocessor), a memory device, or a combination thereof. For example, a portion of the lower semiconductor chip 115 may be a memory device, and another portion of the lower semiconductor chip 115 may be a logic device. The lower molding layer 117 may completely fill a space between the chip bumps 113.

The lower molding layer 117 may include connecting through-holes 121 and element through-holes 123. In detail, the connecting through-holes 121 may expose the lower connecting pads 103, and may be formed along the edge portion of the lower package substrate 101. The element through-holes 123 may be disposed between the lower semiconductor chip 115 and the connecting through-holes 121 adjacent to the lower semiconductor chip 115. The element through-holes 123 may be disposed at both sides of the lower semiconductor chip 115. Bottom surfaces of the element through-holes 123 may be higher than a top surface of the lower package substrate 101.

According to a second exemplary embodiment, the element through-holes 123 may expose the top surface of the lower package substrate 101, as illustrated in FIG. 3.

The upper package 200 may include an upper package substrate 201, first and second upper semiconductor chips 211 and 213 disposed on a top surface of the upper package substrate 201, bonding wires 217 electrically connecting the first and second upper semiconductor chips 211 and 213 to the upper package substrate 201, an upper molding layer 219 covering the first and second upper semiconductor chips 211 and 213 on the upper package substrate 201, and passive elements 223 bonded to a bottom surface of the upper package substrate 201.

The upper package substrate 201 may be a multi-layered printed circuit board (PCB). The upper package substrate 201 may include a plurality of stacked insulating layers 201a and inner interconnections 201b disposed between the insulating layers 201a. Wire-pads 203, which are connected to the bonding wires 217, may be disposed on the top surface of the upper package substrate 201. Upper connecting pads 205 may be disposed on the bottom surface of the upper package substrate 201. The upper connecting pads 205 may face the lower connecting pads 103 through the connecting through-holes 121.

The first and second upper semiconductor chips 211 and 213 may be mounted on the top surface of the upper package substrate 201 by adhesive layers 209. Each of the first and second upper semiconductor chips 211 and 213 may be, for example, a logic device (e.g., a microprocessor), a memory device, or a combination thereof. For example, a portion of each of the first and second upper semiconductor chips 211 and 213 may be a memory device, and another portion of each of the first and second upper semiconductor chips 211 and 213 may be a logic device. In still other exemplary embodiments, one of the first and second upper semiconductor chips 211 and 213 may be a memory device, and another of the first and second upper semiconductor chips 211 and 213 may be a logic device. The number of the upper semiconductor chips mounted on the upper package substrate 201 is not limited to a specific number. In other words, one or more upper semiconductor chips may be mounted on the upper package substrate 201. Bonding pads 215 may be disposed on the first and second upper semiconductor chips 211 and 213. The bonding pads 215 may be electrically connected to the wire-pads 203 through the bonding wires 217, so that the first and second upper semiconductor chips 211 and 213 may be electrically connected to the upper package substrate 201.

Conductive connection parts 227 may be disposed in the connecting through-holes 121. The conductive connection parts 227 electrically connect the lower package 100 to the upper package 200. In more detail, one surface of each of the conductive connection parts 227 may be in contact with each of the upper connecting pads 205, and another surface of each of the conductive connection parts 227 may be in contact with each of the lower connecting pads 103. The conductive connection parts 227 may partially fill the connecting through-holes 121, so that inner sidewalls of the connecting through-holes 121 may be spaced apart from the conductive connection parts 227.

According to a third exemplary embodiment, the conductive connection parts 227 may completely fill the connecting through-holes 121, as illustrated in FIG. 4. In this case, the inner sidewalls of the connecting through-holes 121 may be in contact with the conductive connection parts 227.

The passive elements 223 may be disposed in the element through-holes 123. Surfaces of the passive elements 223 may be covered with an encapsulant. Each of the passive elements 223 may be a chip capacitor, a chip resistor, or an inductor. The chip capacitor may be a decoupling capacitor. The passive element 223 may increase a signal processing speed of the semiconductor chip being an active device or may perform a filtering function. The passive elements 223 may be electrically connected to a first element interconnection 225a and a second element interconnection 225b which are disposed on the insulating layer 201a of the upper package substrate 201. The first element interconnection 225a may be a power source interconnection, and the second element interconnection 225b may be a ground interconnection.

According to a fourth exemplary embodiment, the first element interconnection 225a may be disposed on the insulating layer 101a of the lower package substrate 101, and the second element interconnection 225b may be disposed on the insulating layer 201a of the upper package substrate 201, as illustrated in FIG. 5. The first element interconnection 225a and the second element interconnection 225b may face each other and may be exposed by the element through-hole 123. Each of the passive elements 223 may be provided in each of the element through-holes 123. One surface of each of the passive elements 223 may be in contact with the first element interconnection 225a, and another surface of each of the passive elements 223 may be in contact with the second element interconnection 225b.

Figure 6:
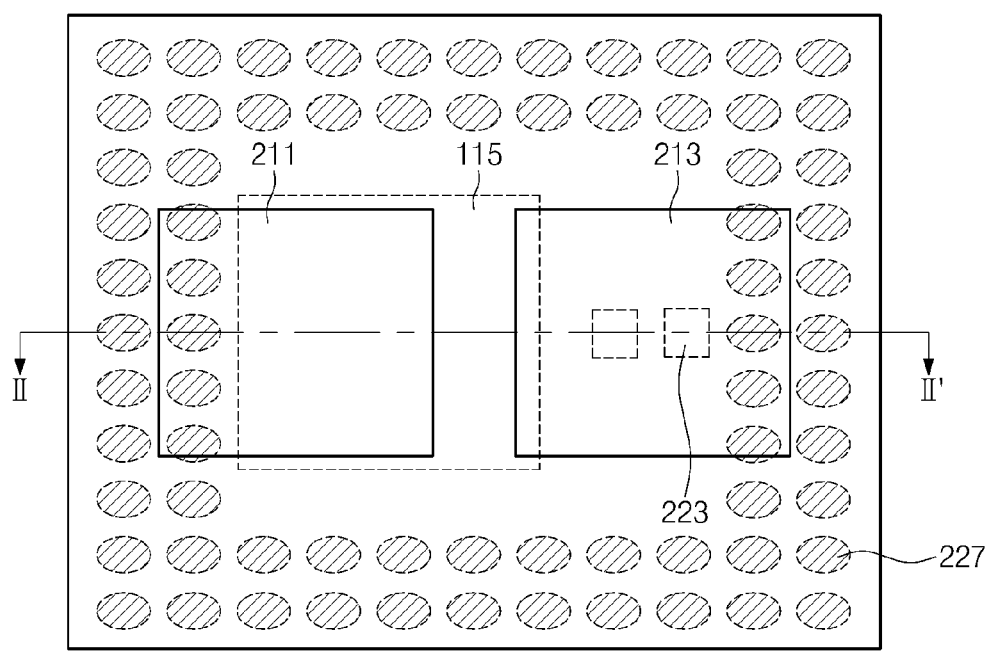
FIG. 6 is a plan view illustrating a semiconductor package according to a fifth exemplary embodiment.
Figure 7:
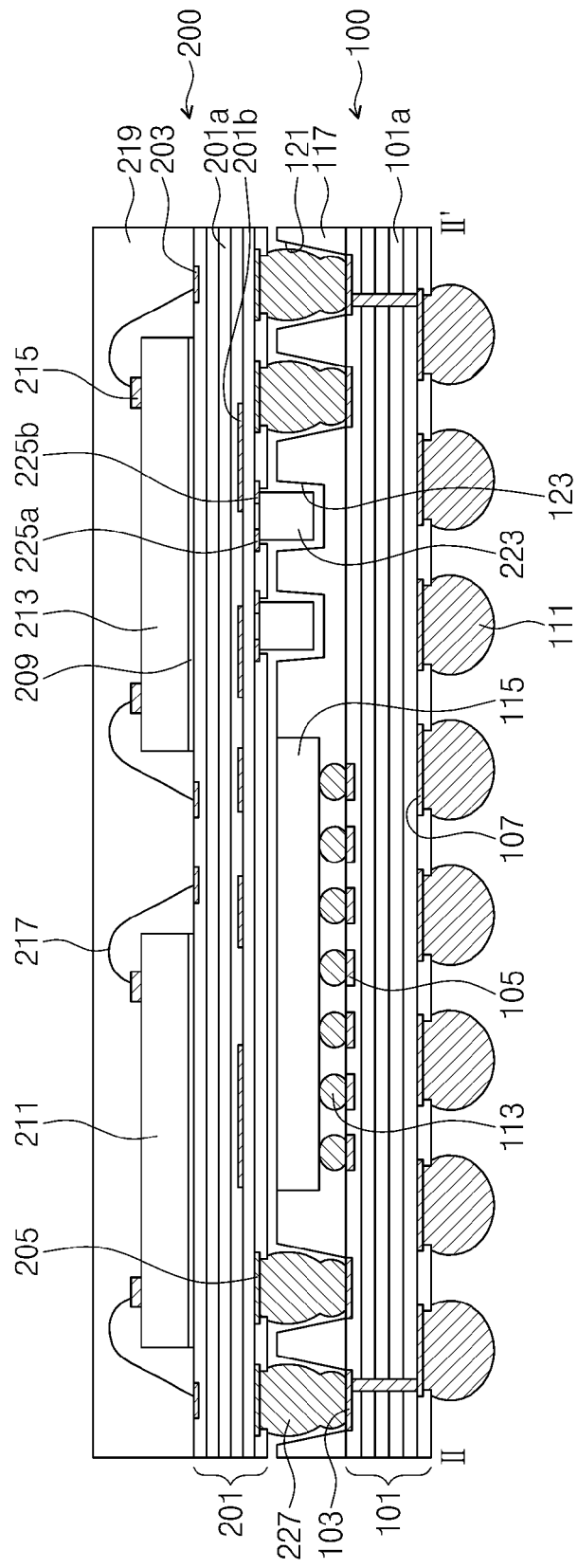
FIG. 7 is a cross-sectional view taken along a line II-II' of FIG. 6.

FIG. 6 is a plan view illustrating a semiconductor package according to a fifth exemplary embodiment. FIG. 7 is a cross-sectional view taken along a line II-II' of FIG. 6. The same descriptions as described above will be omitted.

Referring to FIGS. 6 and 7, a plurality of element through-holes 123 may be disposed between a first sidewall of the lower semiconductor chip 115 and the connecting through-hole 121 adjacent to the first sidewall of the lower semiconductor chip 115. In other words, the plurality of passive elements 223 provided in the element through-holes 123 may be disposed between the first sidewall of the lower semiconductor chip 115 and the conductive connection part 227 provided in the connecting through-hole 121 adjacent to the first sidewall of the lower semiconductor chip 115. A distance between the first sidewall of the lower semiconductor chip 115 and the conductive connection part 227 nearest to the first sidewall of the lower semiconductor chip 115 may be greater than a distance between a second sidewall, which is opposite to the first sidewall, of the lower semiconductor chip 115 and the conductive connection part 227 nearest to the second sidewall of the lower semiconductor chip 115. Thus, the lower semiconductor chip 115 may be disposed at a position laterally moved from a center portion of the lower package substrate 101. The distance between the second sidewall of the lower semiconductor chip 115 and the conductive connection part 227 nearest to the second sidewall of the lower semiconductor chip 115 may be about 100 nm or more.

FIGS. 8A to 8E are cross-sectional views illustrating a method of fabricating a semiconductor package according to exemplary embodiments.

Figure 8A:
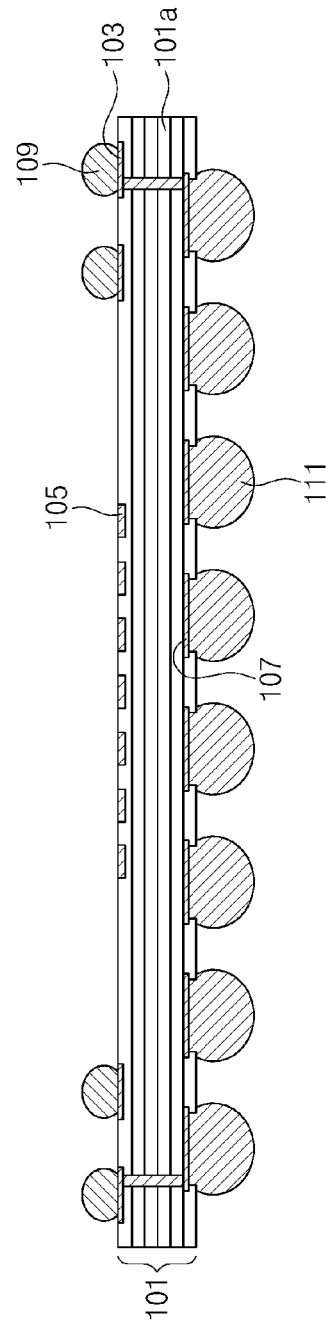

Referring to FIG. 8A, a lower package substrate 101 may be a printed circuit board (PCB). The lower package substrate 101 may include a plurality of insulating layers 101a and inner interconnections (not shown) disposed between the insulating layers 101a. Lower connecting pads 103 may be disposed on a top surface of an edge portion of the lower package substrate 101. Chip pads 105 may be disposed on a top surface of a center portion of the lower package substrate 101. Ball lands 107 may be disposed on a bottom surface of the lower package substrate 101.

Lower conductive connection parts 109 may be formed on the lower connecting pads 103, respectively. The lower conductive connection parts 109 may be formed using a screen print technique, an inkjet technique, or a soldering technique. For example, when the lower conductive connection parts 109 are formed, chip bumps 113 of FIG. 8B may be formed on the chip pads 105 at the same time. In this case, the chip bumps 113 may have the same size as the lower conductive connection parts 109.

External terminals 111 may be formed on the ball lands 107 by a soldering process.

Figure 8B:
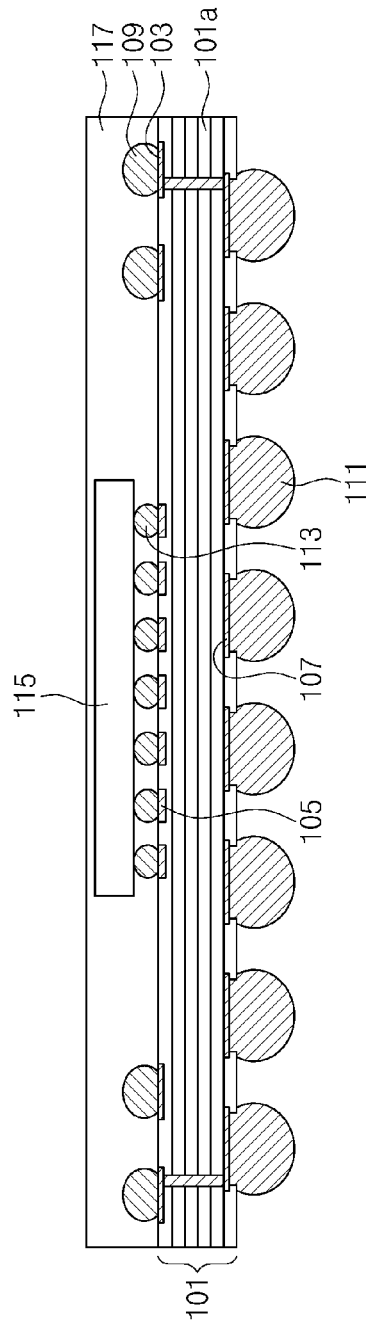

Referring to FIG. 8B, a lower semiconductor chip 115 is mounted on the chip pads 105. In more detail, the chip bumps 113 may be formed on a bottom surface of the lower semiconductor chip 115, and may be bonded to the chip pads 105 such that the lower semiconductor chip 115 may be mounted by a flip chip bonding technique. Thus, the lower semiconductor chip 115 may be electrically connected to the lower package substrate 101 through the chip bumps 113. The lower semiconductor chip 115 may be, for example, a logic device (e.g., a microprocessor), a memory device, or a combination thereof.

A lower molding layer 117 may be formed on the lower package substrate 101. The lower molding layer 117 may fill a space between the chip bumps 113 and may cover the lower conductive connection parts 109 and a top surface of the lower semiconductor chip 115. The lower molding layer 117 may include at least one of an epoxy molding compound (EMC), an epoxy-based resin, and polyimide.

Referring to FIG. 8C, a grinding process may be performed on a top surface of the lower molding layer 117, so that the top surface of the lower semiconductor chip 115 may be exposed by the grinding process.

Figure 8E:
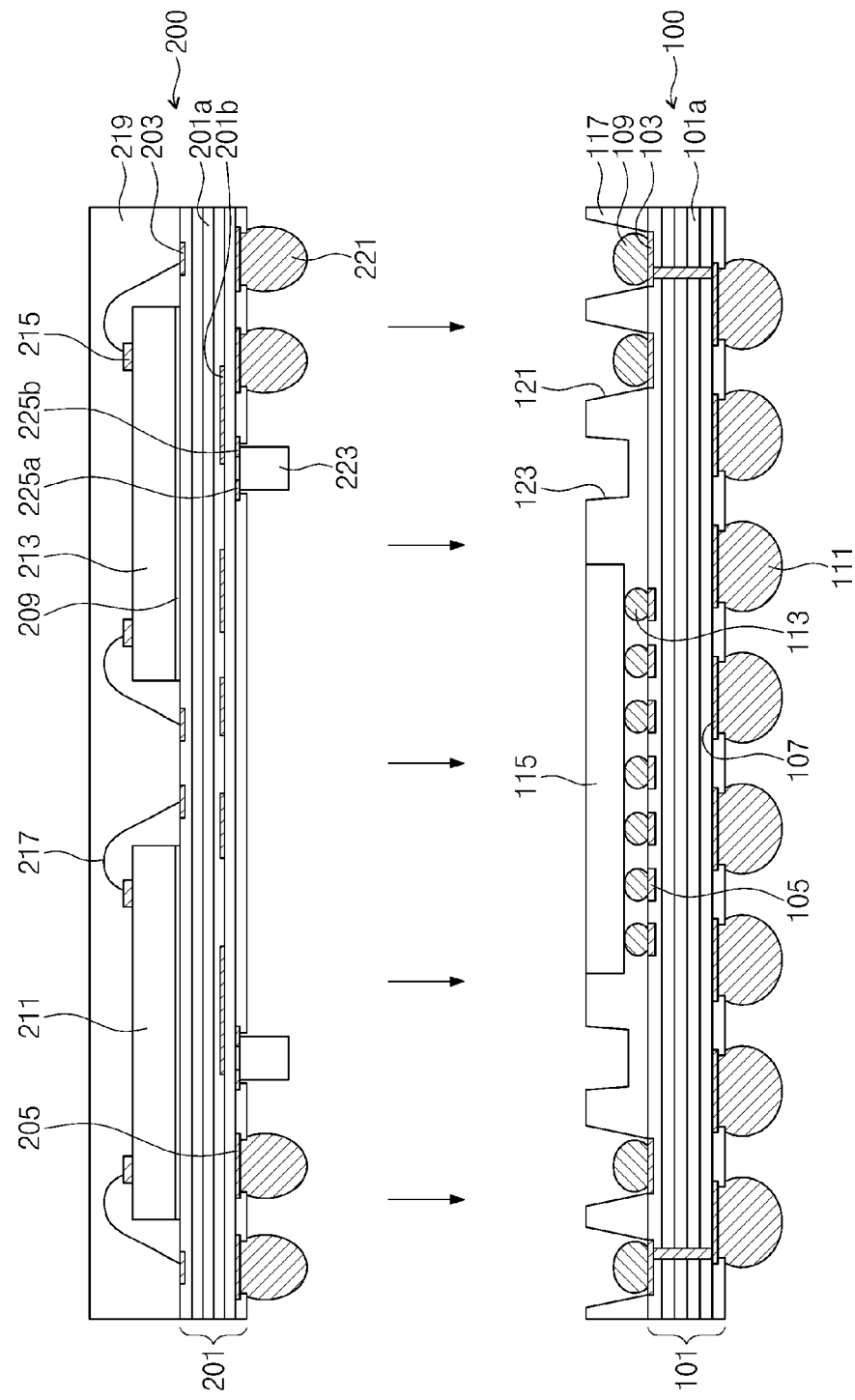

Referring to FIG. 8D, a laser drilling process may be performed on the lower molding layer 117 to form connecting through-holes 121 and element through-holes 123. The connecting through-holes 121 may expose the lower conductive connection parts 109 and the top surface of the lower package substrate 101. The connecting through-holes 121 and the element through-holes 123 may be formed at the same time. Alternatively, the connecting through-holes 121 and the element through-holes 123 may be separately formed. Depths of the element through-holes 123 may be varied depending on heights of passive elements 223 of FIG. 8E provided in the element through-holes 123 in a subsequent process.

In some exemplary embodiments, the element through-holes 123 may be formed not to expose the top surface of the lower package substrate 101. In this case, bottom surfaces of the element through-holes 123 may be higher than the top surface of the lower package substrate 101.

In other exemplary embodiments, the element through-holes 123 may be formed to expose the top surface of the lower package substrate 101, as illustrated in FIGS. 3 and 5. In this case, the element through-holes 123 may have the same height as the connecting through-holes 121. Additionally, portions of the top surface of the lower package substrate 101 may be exposed by the element through-holes 123.

Due to non-uniformity of processes, at least one of the element through-holes 123 may expose the top surface of the lower package substrate 101 but at least another of the element through-holes 123 may not expose the top surface of the lower package substrate 101.

The element through-holes 123 may be formed between the lower semiconductor chip 115 and the lower conductive connection parts 109 adjacent to the lower semiconductor chip 115. The element through-holes 123 may be formed at both sides of the lower semiconductor chip 115. Alternatively, a plurality of the element through-holes 123 may be formed at a side of the lower semiconductor chip 115, as illustrated in FIG. 7.

The element through-holes 123 may be formed during the laser drilling process of forming the connecting through-holes 121. Thus, the passive elements 223 of FIG. 8E bonded to a top surface of an upper package substrate 201 may be provided into the element through-holes 123 in a subsequent process. Thus, a height of a semiconductor package may be reduced or minimized.

Referring to FIGS. 8E and 2, an upper package 200 is stacked on the lower package 100. The upper package 200 may include the upper package substrate 201, first and second upper semiconductor chips 211 and 213 disposed on a top surface of the upper package substrate 201, an upper molding layer 219 covering the first and second upper semiconductor chips 211 and 213 on the upper package substrate 201, upper conductive connection parts 221 bonded to the bottom surface of the upper package substrate 201, and the passive elements 223.

The upper conductive connection parts 221 may be provided into the connecting through-holes 121, and the passive elements 223 may be provided into the element through-holes 123. When the upper package 200 is stacked on the lower package 100, a space may be formed between the top surface of the lower semiconductor chip 115 and the bottom surface of the upper package substrate 201.

The lower conductive connection parts 109 are electrically connected to the upper conductive connection parts 221. In more detail, the upper conductive connection parts 221 may be adhered to the lower conductive connection parts 109 in the connecting through-holes 121, and a reflow process may be performed to melt the lower conductive connection parts 109 and the upper conductive connection parts 221. Thus, conductive connection parts 227 may be formed in the connecting through-holes 121. As a result, the semiconductor package including the stacked lower package 100 and the upper package 200 may be fabricated.

Figure 9:
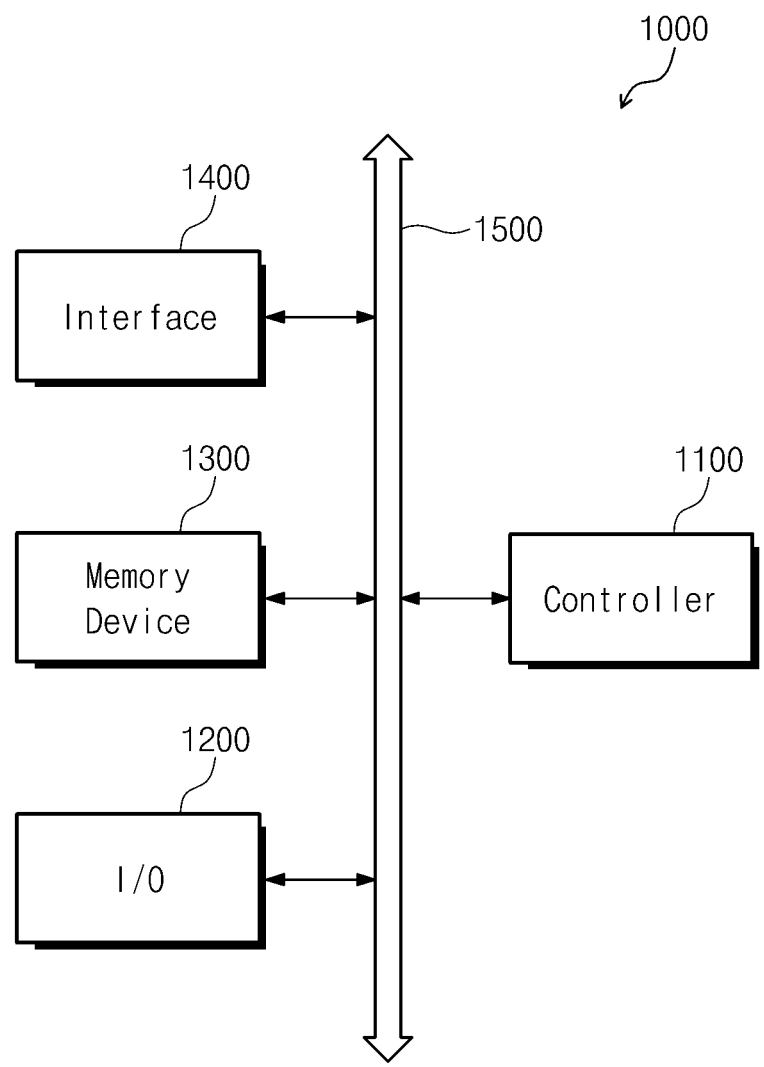
FIG. 9 is a schematic block diagram illustrating an example of an electronic system including a semiconductor package according to an exemplary embodiment.
Figure 10:
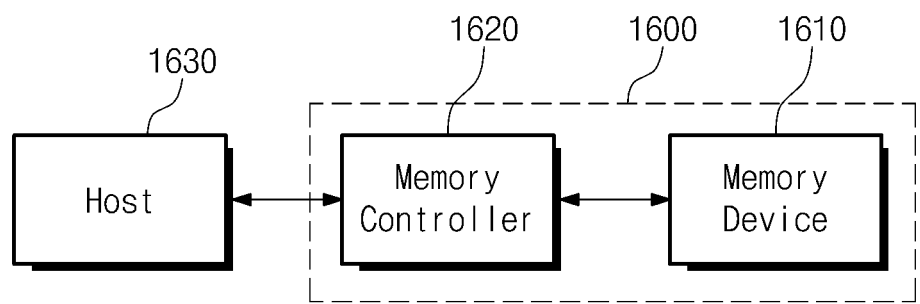
FIG. 10 is a schematic block diagram illustrating an example of a memory card including a semiconductor package according to an exemplary embodiment.

FIG. 9 is a schematic block diagram illustrating an example of electronic systems including semiconductor packages according to exemplary embodiments. FIG. 10 is a schematic block diagram illustrating an example of memory cards including semiconductor packages according to exemplary embodiments.

Referring to FIG. 9, an electronic system 1000 may include a controller 1100, an input/output (I/O) 1200, and a memory device 1300. The controller 1100, the I/O 1200, and the memory device 1300 may communicate with each other through a data bus 1500. The data bus 1500 may correspond to a path through which data are transmitted. For example, the controller 1100 may include at least one of a microprocessor, a digital signal processor, a microcontroller, or other logic devices having a similar function to any one thereof. The controller 1100 and the memory device 1300 may include at least one of the semiconductor packages according to exemplary embodiments. The I/O 1200 may include a keypad, a keyboard and/or a display device. The memory device 1300 may store data and/or commands executed by the controller 1100. The memory device 1300 may include a volatile memory device and/or a non-volatile memory device. In some exemplary embodiments, the memory device 1300 may include a flash memory device. For example, the flash memory device may be installed in an information processing system such as a mobile device or a desk top computer. The flash memory device of the memory device 1300 may be realized as a solid state disk (SSD). In this case, the electronic system 1000 may stably store massive data in the memory device 1300. The electronic system 1000 may further include an interface 1400 for transmitting electrical data to a communication network or for receiving electrical data from a communication network. The interface 1400 may operate by wireless or wire. For example, the interface 1400 may include an antenna for wireless communication or a transceiver for wire communication. Even though not shown in the drawings, the electronic system 1000 may further include an application chipset and/or a camera image processor (CIS).

The electronic system 1000 may be realized as a mobile system, a personal computer, an industrial computer, or a logic system for performing various functions. For example, the electronic system 1000 may be applied to a personal digital assistant (PDA), a portable computer, a web tablet, a mobile phone, a wireless phone, a laptop computer, a memory card, a digital music player, an information transmitting/receiving system, or the like. If the electronic system 1000 performs wireless communication, the electronic system 1000 may be used in a communication interface protocol such as a third generation communication system (e.g., CDMA (Code Division Multiple Access), GSM (Global System for Mobiles), NADC (North American Digital Communications), E-TDMA (Extended-Time Division Multiple Access), WCDMA (Wideband Code-Division Multiple Access), and/or CDMA_2000).

Referring to FIG. 10, a memory card 1600 may include a memory device 1610 and a memory controller 1620. The memory device 1610 and the memory controller 1620 may store data or read stored data. The memory device 1610 may include at least one of the semiconductor packages according to exemplary embodiments. The memory controller 1620 may read or write data from/into the memory device 1610 in response to read/write request of a host 1630.

In the method of fabricating the semiconductor package according to exemplary embodiments, the element through-holes are formed by the laser drilling process forming the connecting through-holes. Thus, the passive element bonded to the bottom surface of the upper package substrate may be provided into the element through-hole when the upper package is stacked on the lower package. As a result, the height of the semiconductor package may be reduced or minimized.

While the inventive concepts have been described with reference to exemplary embodiments, it will be apparent to those skilled in the art that various changes and modifications may be made without departing from the spirits and scopes of the inventive concepts. Therefore, it should be understood that the above exemplary embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
a lower package including a lower package substrate, a lower semiconductor chip stacked on the lower package substrate, and a lower molding layer covering the lower semiconductor chip on the lower package substrate and including an element through-hole; and
an upper package stacked on the lower package, the upper package including an upper package substrate, an upper semiconductor chip stacked on the upper package substrate, and a passive element bonded to a bottom surface of the upper package substrate,
wherein the passive element is inserted in the element through-hole.

2. The semiconductor package of claim 1, wherein the lower molding layer further includes a connecting through-hole in which a conductive connection part is inserted,
wherein the conductive connection part electrically connects the lower package substrate to the upper package substrate, and
wherein the element through-hole is disposed between the lower semiconductor chip and the connecting through-hole.

3. The semiconductor package of claim 2, wherein the element through-hole includes a plurality of element through-holes, and the passive element includes a plurality of passive elements inserted in the plurality of element through-holes, and
wherein the plurality of element through-holes are disposed at both sides of the lower semiconductor chip.

4. The semiconductor package of claim 2, wherein the connecting through-holes includes a plurality of connecting through-holes, and the conductive connection part includes a plurality of conductive connection parts inserted in the plurality of connecting through-holes,
wherein the element through-hole is disposed between a first sidewall of the lower semiconductor chip and the conductive connection part adjacent to the first sidewall of the lower semiconductor chip, and wherein a distance between the first sidewall of the lower semiconductor chip and the conductive connection part adjacent to the first sidewall of the lower semiconductor chip is greater than a distance between a second sidewall of the lower semiconductor chip and the conductive connection part adjacent to the second sidewall of the lower semiconductor chip.

5. The semiconductor package of claim 1, wherein a bottom surface of the element through-hole is higher than a top surface of the lower package substrate.

6. The semiconductor package of claim 5, further comprising:
a first element interconnection and a second element interconnection provided on the bottom surface of the upper package substrate,
wherein the first element interconnection and the second element interconnection are electrically connected to the passive element.

7. The semiconductor package of claim 1, wherein the element through-hole exposes a top surface of the lower package substrate.

8. The semiconductor package of claim 7, further comprising:
a first element interconnection disposed on the top surface of the lower package substrate and exposed by the element through-hole; and
a second element interconnection disposed on the bottom surface of the upper package substrate and facing the first element interconnection,
wherein one surface of the passive element is in contact with the first element interconnection, and another surface of the passive element is in contact with the second element interconnection.

9. The semiconductor package of claim 2, wherein the conductive connection part is in contact with an inner sidewall of the connecting through-hole.

10. A semiconductor package comprising:
a lower package substrate;
a lower semiconductor chip mounted on the lower package substrate;
an upper package substrate stacked on the lower package substrate;
at least one upper semiconductor chip mounted on the upper package substrate; and
a passive element disposed on a bottom surface of the upper package substrate.

11. The semiconductor package of claim 10, wherein the lower package substrate includes a lower molding layer in which a connecting through-hole and an element through-hole are formed,
wherein the passive element is inserted in the element through-hole, and
wherein a conductive connection part which electrically connects the lower package substrate to the upper package substrate is inserted in the connecting through-hole.

12. The semiconductor package of claim 11, wherein the element through-hole includes a plurality of element through-holes, and the passive element includes a plurality of passive elements inserted in the plurality of element through-holes, and
wherein the connecting through-holes includes a plurality of connecting through-holes, and the conductive connection part includes a plurality of conductive connection parts inserted in the plurality of connecting through-holes.

13. The semiconductor package of claim 11, wherein a bottom surface of the element through-hole is higher than a top surface of the lower package substrate.

14. The semiconductor package of claim 11, wherein the element through-hole exposes a top surface of the lower package substrate.

* * * * *